United States Patent
Ma (10) Patent No.: US 9,859,925 B2
(45) Date of Patent: Jan. 2, 2018

(54) LOW-COMPLEXITY FLASH MEMORY DATA-ENCODING TECHNIQUES USING SIMPLIFIED BELIEF PROPAGATION

(71) Applicant: Empire Technology Development LLC, Wilmington, DE (US)

(72) Inventor: Xudong Ma, Clifton Park, NY (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/785,582

(22) PCT Filed: Dec. 13, 2013

(86) PCT No.: PCT/US2013/074948
§ 371 (c)(1),
(2) Date: Oct. 19, 2015

(87) PCT Pub. No.: WO2015/088552
PCT Pub. Date: Jun. 18, 2015

(65) Prior Publication Data
US 2016/0080003 A1    Mar. 17, 2016

(51) Int. Cl.
*H03M 13/00* (2006.01)
*H03M 13/37* (2006.01)
(Continued)

(52) U.S. Cl.
CPC ..... *H03M 13/3746* (2013.01); *G06F 11/1068* (2013.01); *G11C 29/52* (2013.01); *H03M 13/1111* (2013.01); *H03M 13/458* (2013.01)

(58) Field of Classification Search
CPC ............ G06F 11/1068; G11C 29/52; H03M 13/3746; H03M 13/458; H03M 13/1111
(Continued)

(56) References Cited

U.S. PATENT DOCUMENTS 5,469,448 A * 11/1995 Denissen ........... G11B 20/1813
                                              386/E5.015
5,742,934 A    4/1998 Shinohara
(Continued)

FOREIGN PATENT DOCUMENTS

CN    101676882 A    3/2010
CN    101868829 A    10/2010
(Continued)

OTHER PUBLICATIONS

Aritome, S., et al., "Reliability Issues of Flash Memory Cells,", Proceedings of the IEEE, vol. 81, Issue 5, pp. 776-788 (May 1993).
(Continued)

*Primary Examiner* — Guy Lamarre
(74) *Attorney, Agent, or Firm* — Brundidge & Stanger, P.C.

(57) ABSTRACT

Technologies and implementations for encoding and storing data in a solid-state memory device with a reduced number of erasures using a simplified belief-propagation algorithm that includes a set of message-calculation rules that have a low computational complexity are generally disclosed. Additionally, technologies and implementations for decoding data and for error correction are generally disclosed.

21 Claims, 7 Drawing Sheets

(51) Int. Cl.
 *H03M 13/11* (2006.01)
 *G06F 11/10* (2006.01)
 *G11C 29/52* (2006.01)
 *H03M 13/45* (2006.01)

(58) Field of Classification Search
 USPC .................................. 714/733, 731, 726–727
 See application file for complete search history.

(56) References Cited

U.S. PATENT DOCUMENTS

| | | | |
|---|---|---|---|
| 5,873,112 | A | 2/1999 | Norman |
| 6,069,827 | A | 5/2000 | Sinclair |
| 6,492,918 | B1 | 12/2002 | Rezzi et al. |
| 6,933,864 | B1 | 8/2005 | Buch et al. |
| 6,973,613 | B2 | 12/2005 | Cypher |
| 7,065,607 | B2 | 6/2006 | England et al. |
| 7,633,798 | B2 | 12/2009 | Sarin et al. |
| 7,751,237 | B2 | 7/2010 | Alrod et al. |
| 7,907,070 | B2 | 3/2011 | Wu et al. |
| 8,031,526 | B1 | 10/2011 | Wu et al. |
| 8,085,605 | B2 | 12/2011 | Yang et al. |
| 8,423,867 | B2 | 4/2013 | Ma |
| 8,595,591 | B1 | 11/2013 | Shalvi et al. |
| 8,924,832 | B1 | 12/2014 | Lam |
| 2003/0086302 | A1 | 5/2003 | Kurakata et al. |
| 2008/0082744 | A1 | 4/2008 | Nakagawa |
| 2008/0158950 | A1 | 7/2008 | Aritome |
| 2008/0183964 | A1 | 7/2008 | Inoue et al. |
| 2008/0189073 | A1* | 8/2008 | Jagmohan ............... H03M 7/30 702/181 |
| 2008/0244164 | A1 | 10/2008 | Chang et al. |
| 2008/0294965 | A1 | 11/2008 | Ni et al. |
| 2008/0307158 | A1 | 12/2008 | Sinclair |
| 2009/0132756 | A1 | 5/2009 | Hsieh |
| 2009/0144512 | A1 | 6/2009 | Yoshida |
| 2009/0164701 | A1 | 6/2009 | Murray et al. |
| 2009/0217123 | A1 | 8/2009 | Dore et al. |
| 2009/0237999 | A1 | 9/2009 | Li |
| 2010/0070735 | A1 | 3/2010 | Chen et al. |
| 2010/0194607 | A1 | 8/2010 | Smith |
| 2010/0205504 | A1 | 8/2010 | Fung et al. |
| 2010/0321999 | A1 | 12/2010 | Yoo et al. |
| 2011/0022938 | A1 | 1/2011 | Wilkinson et al. |
| 2011/0107056 | A1 | 5/2011 | Kuo |
| 2011/0141815 | A1 | 6/2011 | Haratsch et al. |
| 2011/0145487 | A1 | 6/2011 | Haratsch et al. |
| 2011/0167239 | A1 | 7/2011 | Horn et al. |
| 2011/0182345 | A1* | 7/2011 | Lei ......................... H03M 13/11 375/227 |
| 2011/0216586 | A1 | 9/2011 | Graef et al. |
| 2011/0246710 | A1* | 10/2011 | Strope .................. G11C 7/1006 711/103 |
| 2011/0246739 | A1 | 10/2011 | Matsuda et al. |
| 2011/0305082 | A1 | 12/2011 | Haratsch et al. |
| 2012/0066172 | A1* | 3/2012 | Jebara .................. G06K 9/6297 706/52 |
| 2012/0096289 | A1 | 4/2012 | Kawakami et al. |
| 2012/0110418 | A1 | 5/2012 | Ma |
| 2012/0155535 | A1* | 6/2012 | Hong ..................... H04N 19/51 375/240.03 |
| 2012/0256949 | A1 | 10/2012 | Treat et al. |
| 2012/0268994 | A1 | 10/2012 | Nagashima |
| 2013/0031440 | A1 | 1/2013 | Sharon et al. |
| 2013/0124891 | A1 | 5/2013 | Donaldson |
| 2013/0166994 | A1 | 6/2013 | Mittelholzer et al. |
| 2013/0185598 | A1 | 7/2013 | Haratsch et al. |
| 2013/0212319 | A1 | 8/2013 | Hida et al. |
| 2013/0268723 | A1 | 10/2013 | Jiang et al. |
| 2014/0053043 | A1 | 2/2014 | Shalvi et al. |

FOREIGN PATENT DOCUMENTS

| | | |
|---|---|---|
| EP | 1424631 B1 | 3/2006 |
| EP | 2329380 B1 | 3/2013 |
| JP | 2002351738 A | 12/2002 |
| JP | 2004038971 A | 2/2004 |
| JP | 2008084270 A | 4/2008 |
| JP | 2009116661 A | 5/2009 |
| JP | 2009135854 A | 6/2009 |
| JP | 2009272016 A | 11/2009 |
| KR | 1020100075958 A | 7/2010 |
| WO | 0180249 A1 | 10/2001 |
| WO | 2010002841 A2 | 1/2010 |
| WO | 2010002941 A1 | 1/2010 |
| WO | 2010029411 A2 | 3/2010 |
| WO | 2010033455 A2 | 3/2010 |
| WO | 2012023102 A1 | 2/2012 |
| WO | 2012057777 A1 | 5/2012 |

OTHER PUBLICATIONS

Dong, G., et al., "Using Data Post compensation and Predistortion to Tolerate Cell-to-Cell Interference in MLC NAND Flash Memory," IEEE Transactions on Circuits and Systems—I: Regular Papers, vol. 57, No. 10, pp. 2718-2728 (Oct. 2010).

Extended European Search Report for counterpart Patent Application No. 10859090.2 mailed Feb. 24, 2014.

Heegard, C. and Gamal, A.E., "On the Capacity of Computer Memory with Defects," IEEE Transactions on Information Theory, vol. 29, No. 5, pp. 731-739 (Sep. 1983).

Heegard, C., "Partitioned Linear Block Codes for Computer Memory with 'stuck-at' Defects," IEEE Transactions on Information Theory, vol. 29, No. 6, pp. 831-842 (Nov. 1983).

International Search Report and Written Opinion for International Application No. PCT/US2010/54634 mailed Dec. 14, 2010.

International Search Report and Written Opinion for International Application No. PCT/US2013/74948 mailed May 27, 2014.

International Search Report and Written Opinion for PCT Application No. PCT/US2013/021168 mailed Mar. 4, 2013.

International Search Report and Written Opinion for PCT Application No. PCT/US2013/027851 mailed Apr. 30, 2013.

Jiang, A., and Bruck, J., "Joint Coding for Flash Memory Storage," IEEE International Symposium on Information Theory, 2008. ISIT 2008, pp. 1741-1745 (Jul. 6-11, 2008).

Jiang, A., et al., "Rewriting Codes for Joint Information Storage in Flash Memories," IEEE Transactions on Information Theory, vol. 56, No. 10, pp. 5300-5313 (Oct. 2010).

Kudekar, S., et al., "Linear Programming based Detectors for Two-Dimensional Intersymbol Interference Channels," Computer Science > Information Theory, pp. 1-5 (2011).

Kuznetsov, A.V., and Tsybakov, B.S., "Coding in a Memory with Defective Cells," Probl. Peredachi Inf., vol. 10, Issue 2, pp. 52-60 (1974).

Mézard, M., and Zecchina, R., "Random K-satisfiability problem: From an analytic solution to an efficient algorithm," Physical Review E, vol. 66, No. 5, pp. 056126-1-056126-27 (2002).

Murayama, T., "Thouless-Anderson-Palmer Approach for Lossy Compression," Phys. Rev. E , vol. 69, pp. 1-10 (Mar. 31, 2004).

Murayama, T., and Okada, M., "One step RSB scheme for the rate distortion function," Journal of Physics A: Mathematical and General, vol. 36, No. 43, pp. 1123-1130 (2003).

Olson, A., et al., "Solid State Drives Data Reliability and Lifetime," Copyright 2008 Imation. Imation and the Imation logo are trademarks of Imation Corp., pp. 1-27 (Apr. 7, 2008).

Regalia, P.A., "A Modified Belief Propagation Algorithm for Code Word Quantization," IEEE Transactions on Communications, vol. 57, No. 12, pp. 3513-3517 (Dec. 2009).

Teshome, S., and Chung, T-S., "A Tri-Pool Dynamic Wear-Leveling Algorithm for Large Scale Flash Memory Storage Systems," Proceedings of the 2011 International Conference on Information Science and Applications, pp. 1-6 (Apr. 26-29, 2011).

Wainwright, M.J., et al., "Lossy Source Compression Using Low-Density Generator Matrix Codes: Analysis and Algorithms," IEEE Transactions on Information Theory, vol. 56, No. 3, pp. 1351-1368 (Mar. 2010).

(56) References Cited

OTHER PUBLICATIONS

Wang, J., "Absorbing Set Analysis of LDPC Codes and Read-Channel Quantization in Flash Memory," Doctor of Philosophy in Electrical Engineering, pp. 1-125 (2012).

Wang, J., et al., "LDPC Decoding with Limited-Precision Soft Information in Flash Memories," Computer Science > Information Theory, pp. 1-27 (2012).

Wei, M., et al., "Reliably Erasing Data From Flash-Based Solid State Drives," Proceeding FAST'11 Proceedings of the 9th USENIX conference on File and stroage technologies, pp. 1-13 (2011).

Yaakobi, E., et al., "Error Characterization and Coding Schemes for Flash Memories," 2010 IEEE Globecom Workshops (GC Wkshps), pp. 1856-1860 (Dec. 6-10, 2010).

Zhang, F., et al., "LDPC codes for rank modulation in flash memories," 2010 IEEE International Symposium on Information Theory Proceedings (ISIT), pp. 859-863 (Jun. 13-18, 2010).

Extended European Search Report for counterpart Patent Application No. 10859090.2 mailed Oct. 12, 2015, 9 pages.

Chang, Y., "Conforming Inverted Data Store for Low Power Memory", Proceedings 1999 1Nternational Symposium on Low Power Electronics and Design. (ISLPED). San Diego, CA, Aug. 16-17, 1999; [International Symposium on Low Power Electronics and Design], New York, NY: ACM, US.

Finucane, H., "Worst-case and Average-case Floating Codes for Flash Memory", http://www.math.harvard.edu/theses/senior/finucane/finucane.pdf, 52 pages (Mar. 20, 2009).

Jiang, A., "On the Generalization of Error-Correcting WOM Codes", Information Theory, 2007. ISIT 2007. IEEE International Symposium On, IEEE, Piscataway, NJ, USA, pp. 1391-1395 (Jun. 24-Jun. 29, 2007).

International Preliminary Report on Patentability for International Application No. PCT/US2013/074948 mailed Jun. 23, 2016, 12 pages.

The Korean Intellectual Property Office "Notice of Grounds for Rejection" for Patent Application No. 2015-7019981, mailed Jun. 21, 2016, 10 pages.

Park, K-T., et al., "A Zeroing Cell-to-Cell Interference Page Architecture With Temporary LSB Storing and Parallel MSB Program Scheme for MLC NAND Flash Memories," IEEE Journal of Solid-State Circuits, vol. 43, Issue 4, pp. 919-928 (Apr. 30, 2008).

\* cited by examiner $$\begin{bmatrix} 1 & 1 & 0 & 0 & 0 & 0 \\ 0 & 1 & 1 & 0 & 0 & 0 \\ 1 & 1 & 1 & 0 & 0 & 0 \\ 1 & 0 & 0 & 1 & 1 & 1 \end{bmatrix} \begin{bmatrix} x1 \\ x2 \\ x3 \\ x4 \\ x5 \\ x6 \end{bmatrix} = \begin{bmatrix} 1 \\ 1 \\ 1 \\ 1 \end{bmatrix}$$

FIG. 1

$$\begin{bmatrix} 1 & 1 & 1 \end{bmatrix} \begin{bmatrix} x4 \\ x5 \\ x6 \end{bmatrix} = \begin{bmatrix} 1 \end{bmatrix}$$

600 A computer-program product

602 A signal-bearing medium

604 Machine-readable instructions, which, if executed by one or more processors, operatively enable a computing device to:

Receive information ($\hat{y}$) to be encoded and stored into a memory block; and Solve $A\hat{x} = \hat{y}$ to find binary vector $\hat{x}$ subject to constrain that $x(n) = 0$ if $s(n) = 0$ and in which $A$ is a pre-designed sparse matrix, $\hat{y}$ is the vector of the to-be-recorded information, and $\hat{s}$ is the vector of the current states of the memory cells of the memory block using message-calculation rules:

$$M^0_{i \to a} \leftarrow (1-\alpha)\left(\prod_{b \in N(i)} M^0_{b \to i}\right)\left(\prod_{b \in N(i)\setminus\{a\}} M^0_{b \to i}\right)$$

$$M^1_{j \to a} \leftarrow \left[\alpha\left(\prod_{b \in N(i)} M^0_{b \to i} + \prod_{b \in N(i)} M^1_{b \to i}\right) + \prod_{b \in N(i)} M^1_{b \to i}\right]\left(\prod_{b \in N(i)\setminus\{a\}} M^1_{b \to i}\right)$$

$$M^0_{a \to i} \leftarrow \left[\prod_{j \in N(a)\setminus\{i\}}(M^0_{j \to a} + M^1_{j \to a}) + \prod_{j \in N(a)\setminus\{i\}}(M^0_{j \to a} - M^1_{j \to a})\right]$$

$$M^1_{a \to i} \leftarrow \left[\prod_{j \in N(a)\setminus\{i\}}(M^0_{j \to a} + M^1_{j \to a}) - \prod_{j \in N(a)\setminus\{i\}}(M^0_{j \to a} - M^1_{j \to a})\right]$$

$M^0_{i \to a}$: zero message from a variable $i$ to a check $a$ (tentatively calculated marginal probability that the variable $i$ equals zero);

$M^1_{i \to a}$: one message from a variable $i$ to a check $a$ (tentatively calculated marginal probability that the variable $i$ equals one);

$M^0_{a \to i}$: zero message from a check $a$ to a variable $i$ (tentatively calculated marginal probability that the variable $i$ equals zero);

$M^1_{a \to i}$: one message from a check $a$ to a variable $i$ (tentatively calculated marginal probability that the variable $i$ equals one);

variable nodes are denoted by $i$, $j$, and $k$;

check nodes are denoted by $a$, $b$, and $c$;

$\alpha$ is a pre-designed constant, $0 \leq \alpha \leq 1$;

$N(a)$ denotes the set of neighboring variable nodes of the check node $a$; and $N(i)$ denotes the set of neighboring check nodes of the variable node $i$.

606 a computer-readable medium.

608 a recordable medium.

610 a communications medium.

FIG. 6

700 A computer-program product

702 A signal-bearing medium

704 Machine-readable instructions, which, if executed by one or more processors, operatively enable a computing device to:

Receive information ( $\hat{x}$ ) to be decoded from a memory block; and

Solve $\hat{y} = A\hat{x}$ to find binary vector $\hat{y}$

| 706 a computer-readable medium. | 708 a recordable medium. | 710 a communications medium. |

LOW-COMPLEXITY FLASH MEMORY DATA-ENCODING TECHNIQUES USING SIMPLIFIED BELIEF PROPAGATION

CROSS-REFERENCE TO RELATED APPLICATION

This Application is the U.S. National Stage filing under 35 U.S.C. §371 of International Application Ser. No. PCT/US2013/074948 filed on Dec. 13, 2013. The disclosure of the International Application is hereby incorporated herein by reference in its entirety.

BACKGROUND

Unless otherwise indicated herein, the approaches described in this section are not prior art to the claims in this application and are not admitted to be prior art by inclusion in this section.

BACKGROUND DESCRIPTION

Flash-memory systems store information in flash-memory cells. The stored information is encoded based on threshold voltage levels that have been programmed into or erased from the memory cells. The threshold voltage levels can be increased only by programming operations and can be decreased only by erasure operations. A problem associated with programming and erasing flash memory is that each flash memory cell can endure only a limited number of erasure operations. Consequently, to address the limited number of erasure operations that can be experienced by a flash memory cell, data-encoding techniques are used that reduce the number of erasure operations that are required to record information.

SUMMARY

Detailed herein are various illustrative methods, devices, systems and computer-readable media for encoding and storing data in a solid-state memory, such as a flash memory, with a reduced number of erasures by using a simplified belief-propagation algorithm that includes a set of message-calculation rules that have a low computational complexity. Additionally, this disclosure is drawn, inter alia, to methods, devices, systems and computer-readable media related to a simplified belief-propagation algorithm that includes a set of message-calculation rules that have a low computational complexity for encoding data and related to decoding and for error correction data that has been read from a memory.

The foregoing summary is illustrative only and not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure, and are therefore, not to be considered limiting of its scope, the disclosure will be described with additional specificity and detail through use of the accompanying drawings.

In the drawings.

DETAILED DESCRIPTION

The following description sets forth various examples along with specific details to provide a thorough understanding of claimed subject matter. It will be understood by those skilled in the art that claimed subject matter may be practiced without some or more of the specific details disclosed herein. Further, in some circumstances, well-known methods, procedures, systems, components and/or circuits have not been described in detail, in order to avoid unnecessarily obscuring subject matter that is claimed.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and made part of this disclosure.

This disclosure is drawn, inter alia, to methods, devices, systems and computer-readable media related to storing data in a solid-state memory, such as a flash memory, with a reduced number of erasures by using a simplified belief-propagation algorithm that includes a set of message-calculation rules that have a low computational complexity. Additionally, this disclosure is drawn, inter alia, to methods, devices, systems and computer-readable media for encoding data into a flash memory and for decoding in error-correction coding. Accordingly, embodiments of implementations of the subject matter disclosed herein can be used for both data encoding and error correction.

To illustrate the difficulties involved with encoding data in a manner that reduces the number of erasures that are required to record the information in a solid-state memory, such as a flash-memory device, consider a binary vector $\hat{x}$ representing information that is to be encoded and stored in a memory block of a single-level cell-type flash memory. As used herein, the term "single-level cell-type" means that each memory cell of a flash-memory block can take one of two states that are respectively represented by a 0 or a 1. Accordingly, during each programming operation the state of a cell may be changed from a 1 to a 0, and during each erasure operation the states of all memory cells in the block are returned to a 1.

Let the vector $\hat{s}$ represent the current states of the memory cells in a memory block of a single-level cell-type flash memory. One memory block typically contains, for example, 2048 memory cells. Thus, vector $\hat{s}$ is a 2048-dimension vector having binary elements. For this example, let vector $\hat{y}$ be an 800-dimension binary vector that represents 800 bits of data that will be recorded into the memory block represented by vector $\hat{s}$. Equation 1 below is a (matrix) parity-check equation that is solved to find a binary vector $\hat{x}$ that will be used to encode the information represented by vector $\hat{y}$ and that will be written into the memory block represented by vector $\hat{s}$.

$$A\hat{x} = \hat{y}, \quad (1)$$

which is subject to the constraint $x(n)=0$ if $s(n)=0$ in which n comprises an index, matrix A is a pre-designed sparse matrix, $\hat{y}$ is the vector of the to-be-recorded information, and $\hat{s}$ is the vector of the current states of the memory cells of the memory block. Vector element $x(n)$ is used to denote the n-th element of vector $\hat{x}$. An element $x(n)$ may take a value of 0 or 1, and will be written into the n-th memory cell. The constraint $x(n)=0$ if $s(n)=0$ guarantees that no memory cell is to be changed from state 0 to state 1, thereby avoiding erasure operations when the codeword $\hat{x}$ is written into the memory block. The recorded information vector $\hat{y}$ can be recovered from the codeword vector $\hat{x}$ based on the relationship of Eq. 1, i.e., $\hat{y}=A\hat{x}$. In an alternative exemplary embodiment, matrix A is a low-density parity-check matrix.

Belief-propagation algorithms are parallel algorithms that are used for solving the parity-check equation of Eq. 1, and can usually be efficiently implemented in hardware. In order to find the solution to Eq. 1, a belief-propagation algorithm assigns a probability to each configuration of vector $\hat{x}$. The marginal probability distributions of the elements $x(n)$ of vector $\hat{x}$ are then computed and the values of elements $x(n)$ are determined according to their marginal probability distributions. The values of elements $x(n)$ need not be determined all at one time, and it usually happens that the values of elements $x(n)$ are determined by several iterations. Values of some elements $x(n)$ that are determined during an iteration result in a parity-check equation having fewer unknown variables. The marginal distributions of the remaining unknown variables $x(n)$ are then calculated and another iteration of variable determination is performed. Each iteration of variable determination is referred to as a decimation.

Figure 1:
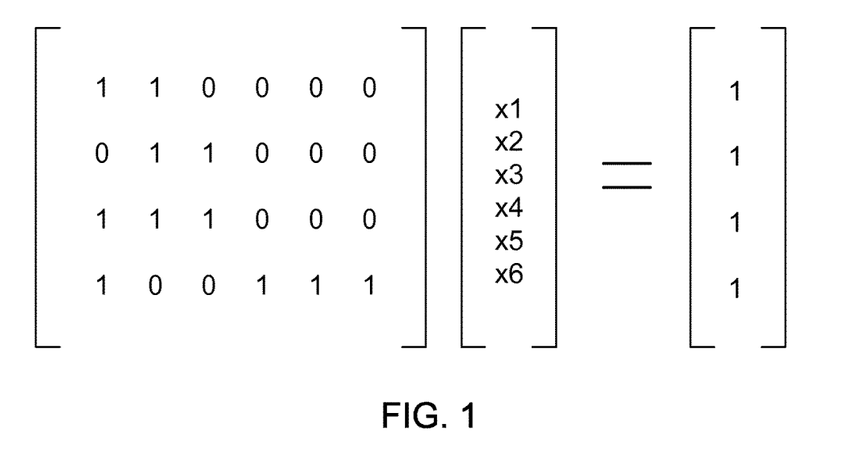
FIG. 1 depicts an example problem that is to be solved for the parity-check equation of Equation 1.

Consider, for example, the example parity-check equation depicted in FIG. 1, in which the unknown variables $x(1)$, $x(2)$, $x(3)$, $x(4)$, $x(5)$ and $x(6)$ (e.g., elements $x(n)$ of vector $\hat{x}$) may take the values 0 or 1. Probability distributions can be assigned to the different configurations of the binary variables $x(1)$-$x(6)$. A particular configuration of the variables $x(1)$-$x(6)$ is considered to be valid if the parity-check equation (Eq. 1) is satisfied. Otherwise, the particular configuration is considered to be invalid. For example, the configuration $x(1)=0$, $x(2)=1$, $x(3)=0$, $x(4)=0$, $x(5)=0$ and $x(6)=1$ is valid, whereas the configuration $x(1)=0$, $x(2)=0$, $x(3)=0$, $x(4)=0$, $x(5)=0$ and $x(6)=0$ is invalid. Probability distributions may be assigned, such that all invalid configurations have zero probability, and all valid configurations are equally probable.

For all valid configurations $x(1)=0$, $x(2)=1$, $x(3)=0$, the marginal distributions are computed as $pr(x(1)=0)=1$, $pr(x(1)=1)=0$, $pr(x(2)=0)=0$, $pr(x(2)=1)=1$, $pr(x(3)=0)=1$, and $pr(x(3)=0)=0$, in which $pr(x(n))$ is the marginal probability of element $x(n)$. From the marginal distribution of $x(1)$, it may be concluded that there are more valid configurations with $x(1)=0$ than valid configurations with $x(1)=1$. Therefore, based on this decimation, it may be determined that $x(1)=0$. Similarly, it may be determined that $x(2)=1$ and $x(3)=0$.

Figure 2:
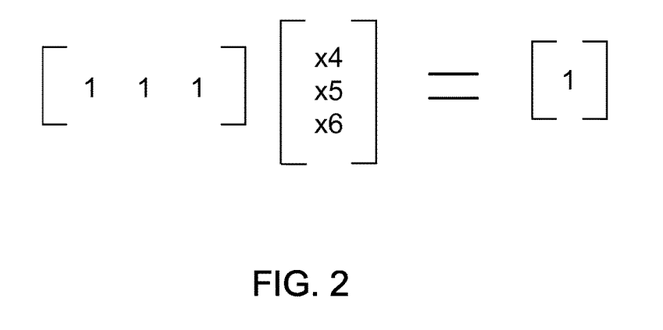
FIG. 2 depicts the example problem of FIG. 1 after one iteration of determining the probability distributions of the unknown variables.

Next, the determined values of $x(1)$, $x(2)$ and $x(3)$ are substituted into the parity-check equation in FIG. 1 to obtain a smaller sized parity-check equation that is depicted in FIG. 2. Probability distributions may again be assigned and the marginal distributions calculated. In the second decimation, the marginal distribution may be equally probable. Consequently, $x(4)$ may be set to either 0 or 1. If it is determined that $x(4)=0$ in the second decimation and it is determined that $x(5)=0$ in the third decimation, then $x(6)=1$ in the final decimation. Thus, the parity-check equation is solved, and one solution $x(1)=0$, $x(2)=1$, $x(3)=0$, $x(4)=0$, $x(5)=0$ and $x(6)=1$ is obtained.

The marginal distributions are easily computed for a data-encoding problem having a size that is similar to the parity-check equations depicted in FIGS. 1 and 2. For data-encoding problems having a larger size, however, computation of the marginal distributions may quickly become intractable.

Belief-propagation algorithms that are used to solve the parity-check equation of Eq. 1 calculate the marginal distributions approximately by exchanging messages between neighboring variable nodes and check nodes. Variable nodes are the unknown variables in the parity-check equation, and check nodes are the rows of the parity-check equation. The messages that are exchanged between neighboring variable nodes and check nodes are tentative calculation results of marginal probability distributions. The parity-check equation depicted in FIG. 1, for example, has six variables (e.g., variable nodes) and four parity checks (e.g., check nodes). A variable is said to be neighboring to a parity check and at the same time the parity check is neighboring to the variable if the variable is involved in the parity check. For example, in the parity-check equation depicted in FIG. 1, the variable $x(1)$ is involved in the first, third and fourth rows of the parity-check equation. Thus, the variable node $x(1)$ is neighboring to the first, third and fourth parity check nodes. Many belief-propagation algorithms differ in the way that messages are calculated, exchanged and/or decimated.

One significant consideration for selection of a belief-propagation algorithm to solve a parity-check equations like Eq. 1 is convergence of the algorithm. Depending on the instances of the problem, belief-propagation algorithms (1) may not converge, (2) may converge to a local minima, or (3) may converge to meaningless solutions.

Embodiments of the subject matter disclosed herein provide a simplified belief-propagation algorithm that includes a set of message-calculation rules that have a significantly lower computational complexity in comparison to the message-calculation rules associated with the other approaches.

Accordingly, embodiments of hardware implementations of the subject matter disclosed herein avoid a hardware bottlenecks. Moreover, embodiments of hardware implementations of the subject matter disclosed herein can be used for both data encoding and error correction.

The message-calculation rules provided by embodiments of the subject matter disclosed herein that are passed between neighboring variable nodes and check nodes are set forth below in contrast to the message-calculation rules that are passed between neighboring variable nodes and check nodes that are associated with a Low-Density Parity-Check (LDPC) code decoding technique. LDPC codes are state-of-the-art error-correction codes that are widely used in computer data-storage systems for error-correction in, for example, magnetic hard drives. The standard decoding algorithm of LDPC codes is a variation of a belief-propagation algorithm.

The message-calculation rules for the messages passed between the variable nodes and the check nodes provided by embodiments of the subject matter disclosed herein are set forth in Eqs. 2-5. The message-calculation rules for LDPC code decoding error correction are set forth in Eqs. 6-9.

Equations 2 and 3 set forth the message-calculation rules for the messages that are passed from variable nodes to check nodes that are associated with embodiments of the subject matter disclosed herein.

$$M_{i \to a}^0 \leftarrow (1-\alpha)\left(\prod_{b \in N(i)} M_{b \to i}^0\right)\left(\prod_{b \in N(i)\backslash\{a\}} M_{b \to i}^0\right) \quad (2)$$

$$M_{i \to a}^1 \leftarrow \left[\alpha\left(\prod_{b \in N(i)} M_{b \to i}^0 + \prod_{b \in N(i)} M_{b \to i}^1\right) + \prod_{b \in N(i)} M_{b \to i}^1\right]\left(\prod_{b \in N(i)\backslash\{a\}} M_{b \to i}^1\right) \quad (3)$$

Equations 4 and 5 set forth the message-calculation rules for the messages that are passed from check nodes to variable nodes that are associated with the subject matter disclosed herein.

$$M_{a \to i}^0 \leftarrow \left[\prod_{j \in N(a)\backslash\{i\}} (M_{j \to a}^0 + M_{j \to a}^1) + \prod_{j \in N(a)\backslash\{i\}} (M_{j \to a}^0 - M_{j \to a}^1)\right] \quad (4)$$

$$M_{a \to i}^1 \leftarrow \left[\prod_{j \in N(a)\backslash\{i\}} (M_{j \to a}^0 + M_{j \to a}^1) - \prod_{j \in N(a)\backslash\{i\}} (M_{j \to a}^0 - M_{j \to a}^1)\right] \quad (5)$$

The symbols used in Eqs. 2-5 are defined as:
$M_{i \to a}^0$: zero message from a variable i to a check a (tentatively calculated marginal probability that the variable i equals zero);
$M_{i \to a}^1$: one message from a variable i to a check a (tentatively calculated marginal probability that the variable i equals one);
$M_{a \to i}^0$: zero message from a check a to a variable i (tentatively calculated marginal probability that the variable i equals zero);
$M_{a \to i}^1$: one message from a check a to a variable i (tentatively calculated marginal probability that the variable i equals one);
variable nodes are denoted by i, j, and k;
check nodes are denoted by a, b, and c;
$\alpha$ is a pre-designed constant, $0 \leq \alpha \leq 1$;
N(a) denotes the set of neighboring variable nodes of the check node a; and
N(i) denotes the set of neighboring check nodes of the variable node i.

The message-calculation rules for the messages that are passed from variable nodes to check nodes associated with LDPC codes for error-correction are set forth in Eqs. 6 and 7.

$$M_{i \to a}^0 \leftarrow P(x_i = 0 | y_i)\left(\prod_{b \in N(i)\backslash\{a\}} M_{b \to i}^0\right) \quad (6)$$

$$M_{i \to a}^1 \leftarrow P(x_i = 1 | y_i)\left(\prod_{b \in N(i)\backslash\{a\}} M_{b \to i}^1\right) \quad (7)$$

in which $P(x_i=0|y_i)$ and $P(x_i=1|y_1)$ are the probabilities of the variable $x_i$ being zero or one conditioned on the received noisy observation respectively.

The message-calculation rules for the messages that are passed from check nodes to variable nodes associated with LDPC codes for error-correction are shown in Equations 8 and 9.

$$M_{a \to i}^0 \leftarrow \left[\prod_{j \in N(a)\backslash\{i\}} (M_{j \to a}^0 + M_{j \to a}^1) + \prod_{j \in N(a)\backslash\{i\}} (M_{j \to a}^0 - M_{j \to a}^1)\right] \quad (8)$$

$$M_{a \to i}^1 \leftarrow \left[\prod_{j \in N(a)\backslash\{i\}} (M_{j \to a}^0 + M_{j \to a}^1) - \prod_{j \in N(a)\backslash\{i\}} (M_{j \to a}^0 - M_{j \to a}^1)\right] \quad (9)$$

As can be seen, the message-calculation rules for the messages that are passed between the variable nodes and the check nodes associated with embodiments of the subject matter disclosed herein (e.g., Eqs. 2-5) provide systems having a significantly lower computational complexity than previous approaches.

It may be noted that the message-calculation rules for the messages that are passed between the variable nodes and the check nodes that are associated with embodiments of the subject matter disclosed herein (e.g., Eqs. 2-5) have an appearance that is similar to the message-calculation rules for the messages that are passed between the variable nodes and the check nodes that are associated with the LDPC codes for error-correction (e.g., Eqs. 6-9), except that for embodiments of the subject matter disclosed herein convex combination adjust terms are introduced at the variable nodes in Eqs. 2-5 so that the message-calculation rules converge to a meaningful solution. In contrast to the subject matter disclosed herein, convex combination adjust terms have been conventionally used at the check nodes for calculating messages passed from check nodes to variable nodes.

Figure 3:
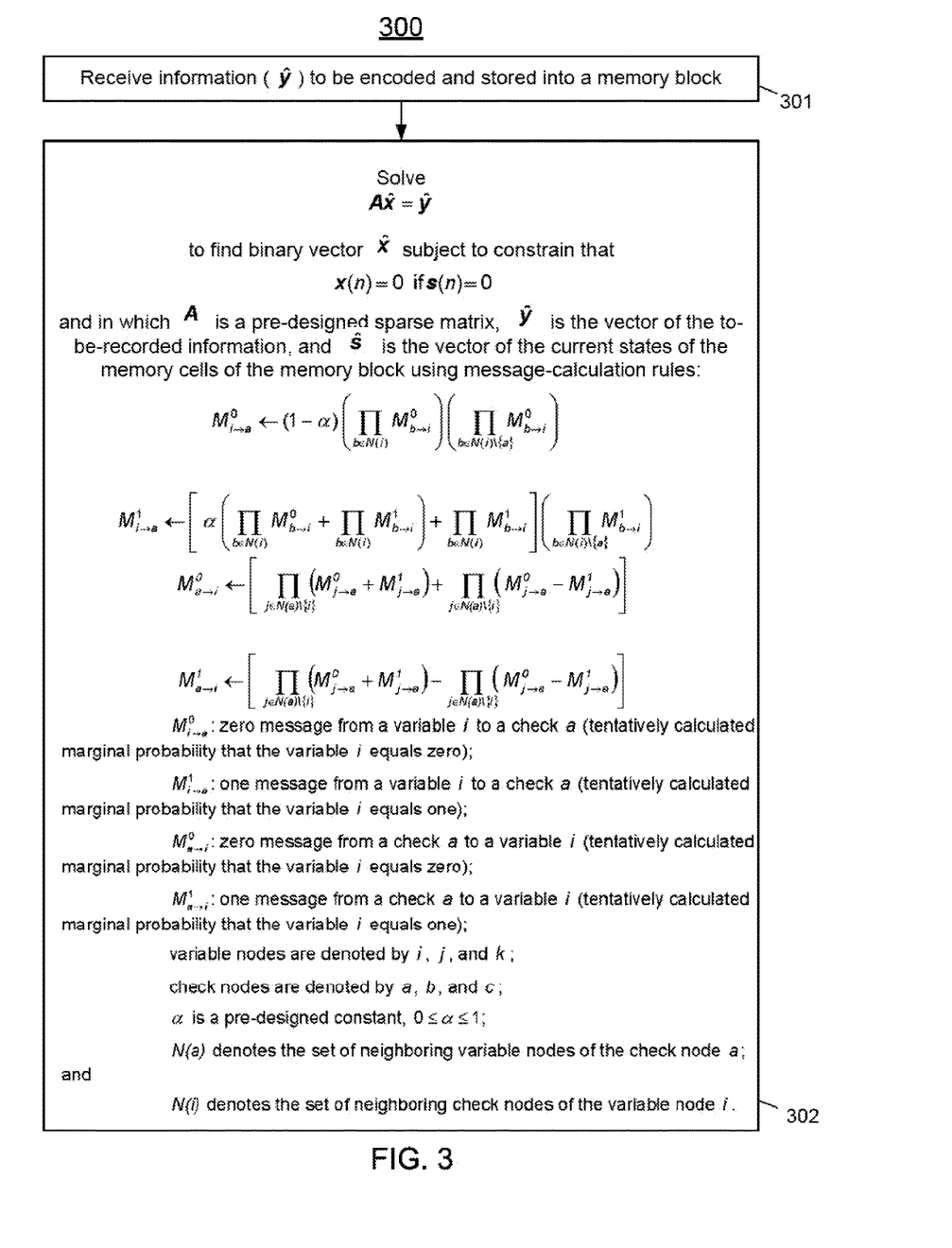
FIG. 3 depicts a flow diagram of a method for encoding information for storage in a solid-state memory using a belief-propagation algorithm that includes a set of message-calculation rules for storing the data with a reduced number of erasures according to the subject matter disclosed herein.

FIG. 3 depicts a flow diagram 300 of a method for encoding information for storage using a belief-propagation algorithm that includes a set of message-calculation rules passed between variable nodes and check nodes for storing data in a solid-state memory block with a reduced number of erasures according to the subject matter disclosed herein. At 301, information is received that is to be encoded and stored into a solid-state memory block. At 302, the parity-check equation of Eq. 1 is solved using the message-calculation rules of Eqs. 2-5.

In the process of determining values of data elements for binary vector $\hat{x}$, it may be found that for some parity checks (e.g., rows of the matrix), there exists exactly one unknown data element involved in the parity check. The only unknown data element of the parity check can then be determined from the parity-check equation. For example, if one row of the matrix A is x(1)+x(2)=1, and x1 has already been determined, then the unknown x2 can be determined.

In an alternative exemplary embodiment, as such parity-checks are found, the values of the unknown data element are determined accordingly. The encoding algorithm may be speeded up. According to embodiments of the subject matter disclosed herein, each iteration of variable determinations is referred to as a decimation and the number of variables determined in each decimation may vary. Accordingly, encoding may be speeded-up if a large number of variables are determined during each iteration. Because the message-passing technique is approximate, using such a large number of variables that are determined during an iteration may result in encoding errors. That is, in a resulting solution, not all rows of the equation $A\hat{x}=\hat{y}$ are satisfied. There may exist several rows that are not satisfied. If that is the case, then an auxiliary memory may be used to record the indexes of the unsatisfied rows so that the encoding errors may be corrected in the system by looking at the auxiliary memories. Nevertheless, despite the possible encoding errors, this alternative exemplary embodiment provides fast computing speed and low computational complexity.

Figure 4:
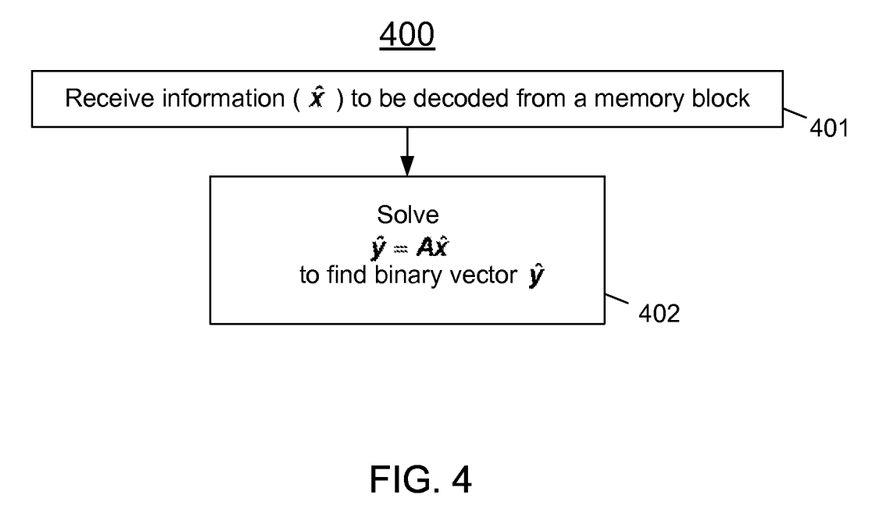
FIG. 4 depicts a flow diagram of a method for decoding data and/or for error correction according to the subject matter disclosed herein.

FIG. 4 depicts a flow diagram 400 of a method for decoding information according to the subject matter disclosed herein. At 401, information is received that is to be decoded from a memory block. At 402, the parity-check equation of Eq. 1 is solved for vector $\hat{y}$.

According to Eqs. 4, 5, 8 and 9, the message-calculation rules for all of the message computing from check nodes to variable nodes are the same for error correction and data encoding. Consequently, the same check processing units can be used for both error correction and data encoding without hardware or software reconfigurations.

Figure 5:
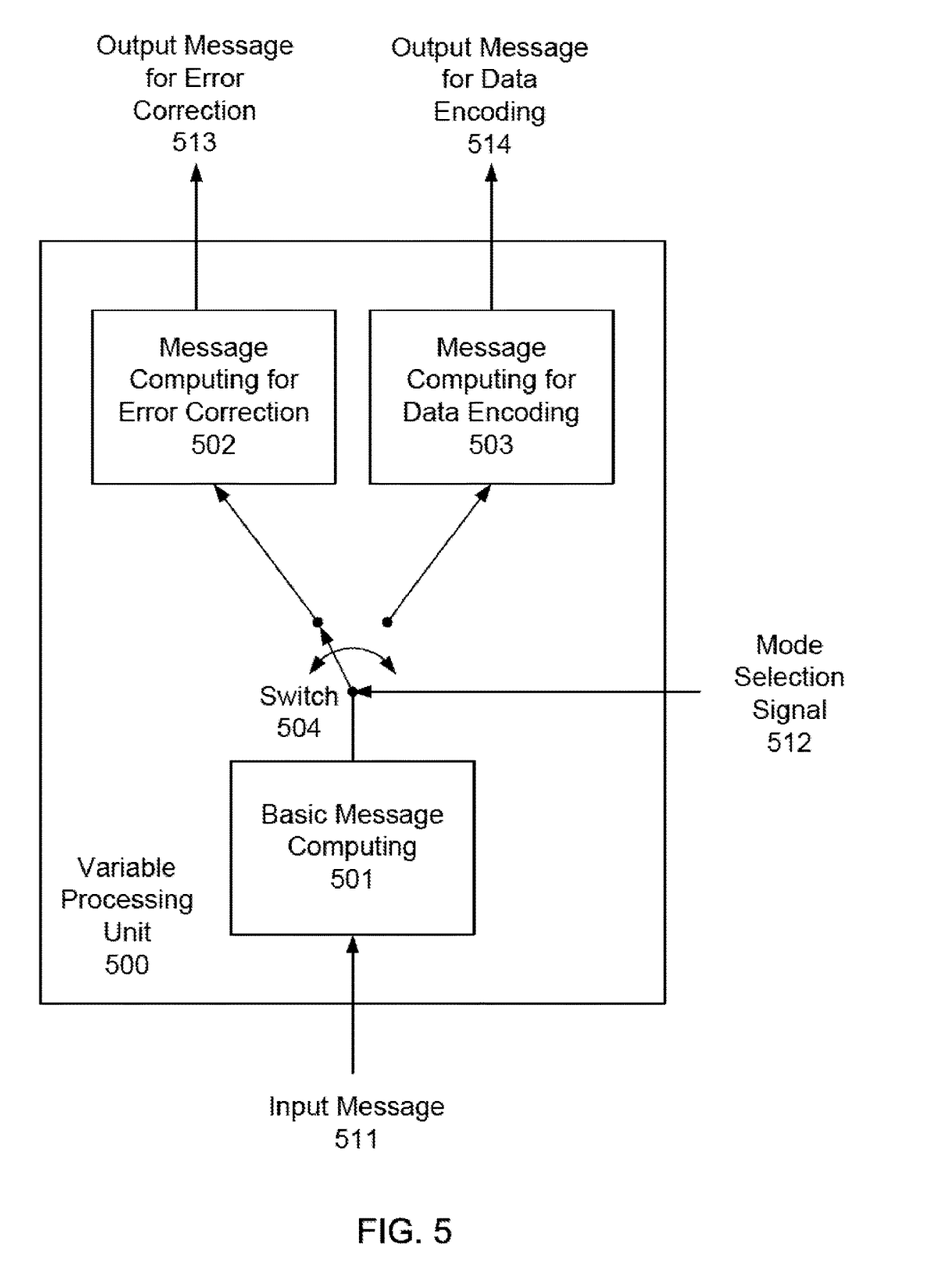
FIG. 5 depicts a functional block diagram of an exemplary embodiment of a variable processing system/unit capable of providing flash-memory data encoding and capable of LDPC error corrections according to the subject matter disclosed herein.

FIG. 5 depicts a functional block diagram of an exemplary embodiment of a variable processing system/unit 500 capable of providing flash-memory data encoding according to the subject matter disclosed herein and capable of LDPC error corrections. Variable processing system/unit 500 comprises a basic message computing block 501, a message computing for error correction block 502, a message computing for data encoding block 503, and a switch 504. The variable processing unit 500 receives a set of input messages 511. A mode-selection signal 512 is applied to switch 504 to select whether the intermediate computing results of the basic message-computing block 501 are directed to error-correction message computing block 502 or data-encoding message computing block 503. If the intermediate computing results are directed to error-correction message computing block 502, then the output messages for error correction 513 are computed. As shown in FIG. 5, switch 504 is configured to direct the output from basic message computing block 501 to message computing for error correction block 502. Alternatively, if the intermediate computing results are directed to the data-encoding message computing block 503, then the output messages for data encoding 514 are computed. In such a situation in which switch 504 is configured to direct the output from basic message computing block 501 to message computing for error correction block 502, the variable processing unit 500 would be used for data encoding.

In general, the method described with respect to FIG. 3 and elsewhere herein may be implemented as a computer-program product, executable on any suitable computing system, or the like. For example, a computer-program product may be provided for a simplified belief-propagation algorithm according to the subject matter disclosed herein that includes a set of message-calculation rules that have a low computational complexity for encoding data to be stored in a solid-state memory block with a reduced number of erasures. Example computer-program products are described with respect to FIG. 5 and elsewhere herein.

Figure 6:
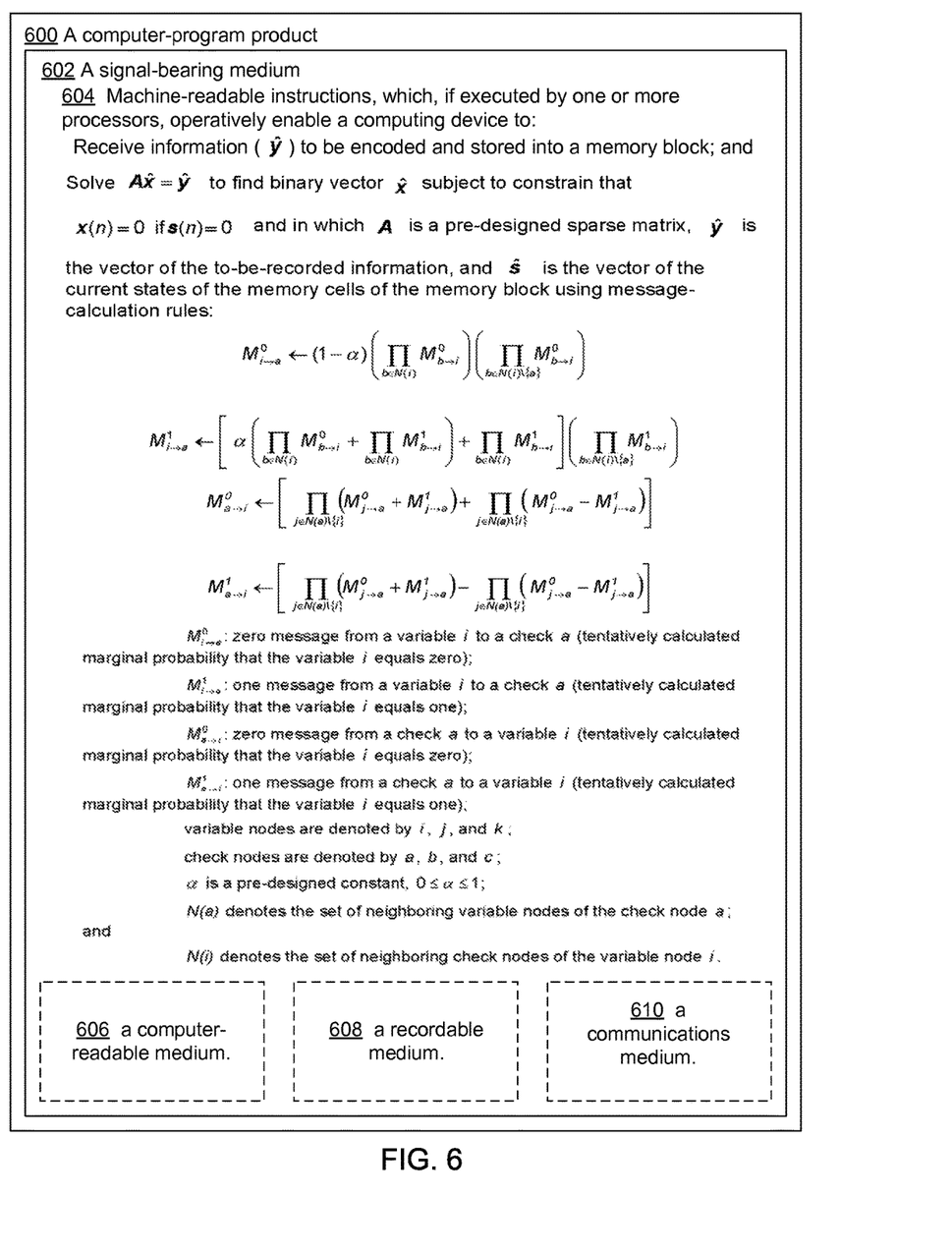
FIG. 6 depicts an example computer-program product arranged in accordance with at least some embodiments of the present disclosure.

FIG. 6 depicts an example computer-program product 600, arranged in accordance with at least some embodiments of the present disclosure. The computer-program product 600 may include a machine-readable non-transitory medium having stored therein a plurality of instructions that, when executed, operatively enable a simplified belief-propagation algorithm that includes a set of message-calculation rules that have a low computational complexity for encoding data to be stored in a solid-state memory block with a reduced number of erasures according to the processes and methods discussed herein. The computer-program product 600 may include a signal-bearing medium 602. The signal-bearing medium 602 may include one or more machine-readable instructions 604, which, when executed by one or more processors, may operatively enable a computing device to a simplified belief-propagation algorithm according to the subject matter disclosed herein that includes a set of message-calculation rules that have a low computational complexity for encoding data to be stored in a solid-state memory block with a reduced number of erasures. In various examples, the devices discussed herein may use some or all of the machine-readable instructions.

In some examples, the machine-readable instructions 604 may include receiving information to be encoded and stored into a block of memory. In some examples, the machine-readable instructions 604 may include solving a parity-check equation having the form of Eq. 1 using the techniques and the message-calculation rules set forth according to embodiments of the subject matter disclosed herein.

In some implementations, signal-bearing medium 602 may encompass a computer-readable medium 606, such as, but not limited to, a hard disk drive (HDD), a Compact Disc (CD), a Digital Versatile Disk (DVD), a digital tape, memory, etc. In some implementations, the signal-bearing medium 602 may encompass a recordable medium 608, such as, but not limited to, memory, read/write (R/W) CDs, R/W DVDs, etc. In some implementations, the signal-bearing medium 602 may encompass a communications medium 610, such as, but not limited to, a digital and/or an analog communication medium (e.g., a fiber optic cable, a waveguide, a wired communication link, a wireless communication link, etc.). In some examples, the signal-bearing medium 602 may encompass a machine-readable non-transitory medium.

The method generally described with respect to FIG. 4 and elsewhere herein may be implemented as a computer-program product, executable on any suitable computing system, or the like. For example, a computer-program product may be provided for decoding data read from a memory block. Example computer-program products are described with respect to FIG. 7 and elsewhere herein.

Figure 7:
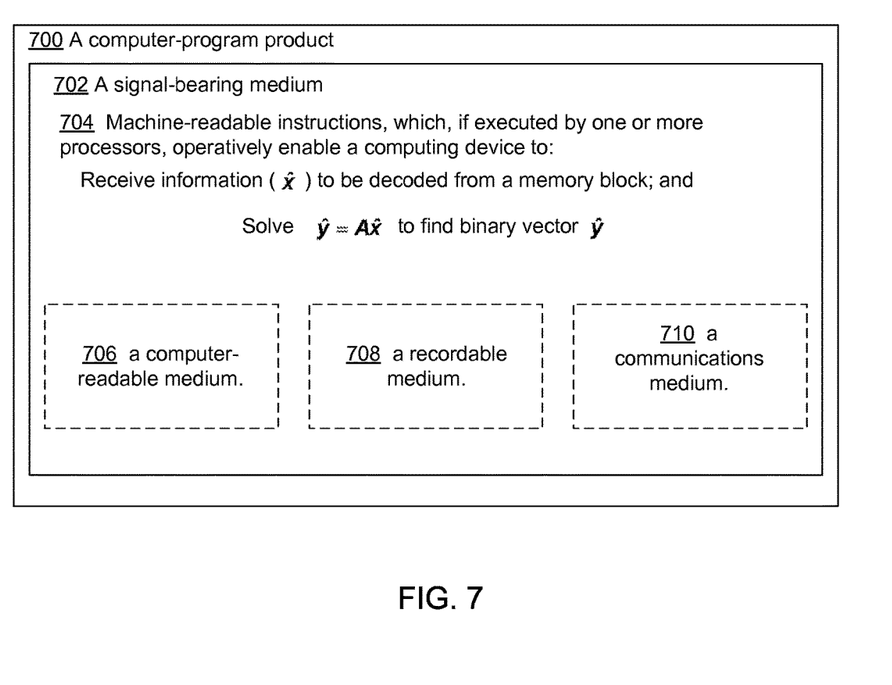
FIG. 7 depicts another example computer-program product arranged in accordance with at least some embodiments of the present disclosure.

FIG. 7 depicts an example computer-program product 700, arranged in accordance with at least some embodiments of the present disclosure. The computer-program product 700 may include machine-readable non-transitory medium having stored therein a plurality of instructions that, when executed, operatively enable an algorithm for decoding data read from a memory block according to the processes and methods discussed herein. The computer-program product 700 may include a signal-bearing medium 702. The signal-bearing medium 702 may include one or more machine-readable instructions 704, which, when executed by one or more processors, may operatively enable a computing device to provide the functionality described herein. In various examples, the devices discussed herein may use some or all of the machine-readable instructions.

In some examples, the machine-readable instructions 704 may include receiving information to be decoded from a block of memory. In some examples, the machine-readable instructions 704 may include solving a parity-check equation having the form of Eq. 1 using the techniques set forth according to embodiments of the subject matter disclosed herein.

In some implementations, signal-bearing medium 702 may encompass a computer-readable medium 706, such as, but not limited to, a hard disk drive (HDD), a Compact Disc (CD), a Digital Versatile Disk (DVD), a digital tape, memory, etc. In some implementations, the signal-bearing medium 702 may encompass a recordable medium 708, such as, but not limited to, memory, read/write (R/W) CDs, R/W DVDs, etc. In some implementations, the signal-bearing medium 702 may encompass a communications medium 710, such as, but not limited to, a digital and/or an analog communication medium (e.g., a fiber optic cable, a waveguide, a wired communication link, a wireless communication link, etc.). In some examples, the signal-bearing medium 702 may encompass a machine-readable non-transitory medium.

Figure 8:
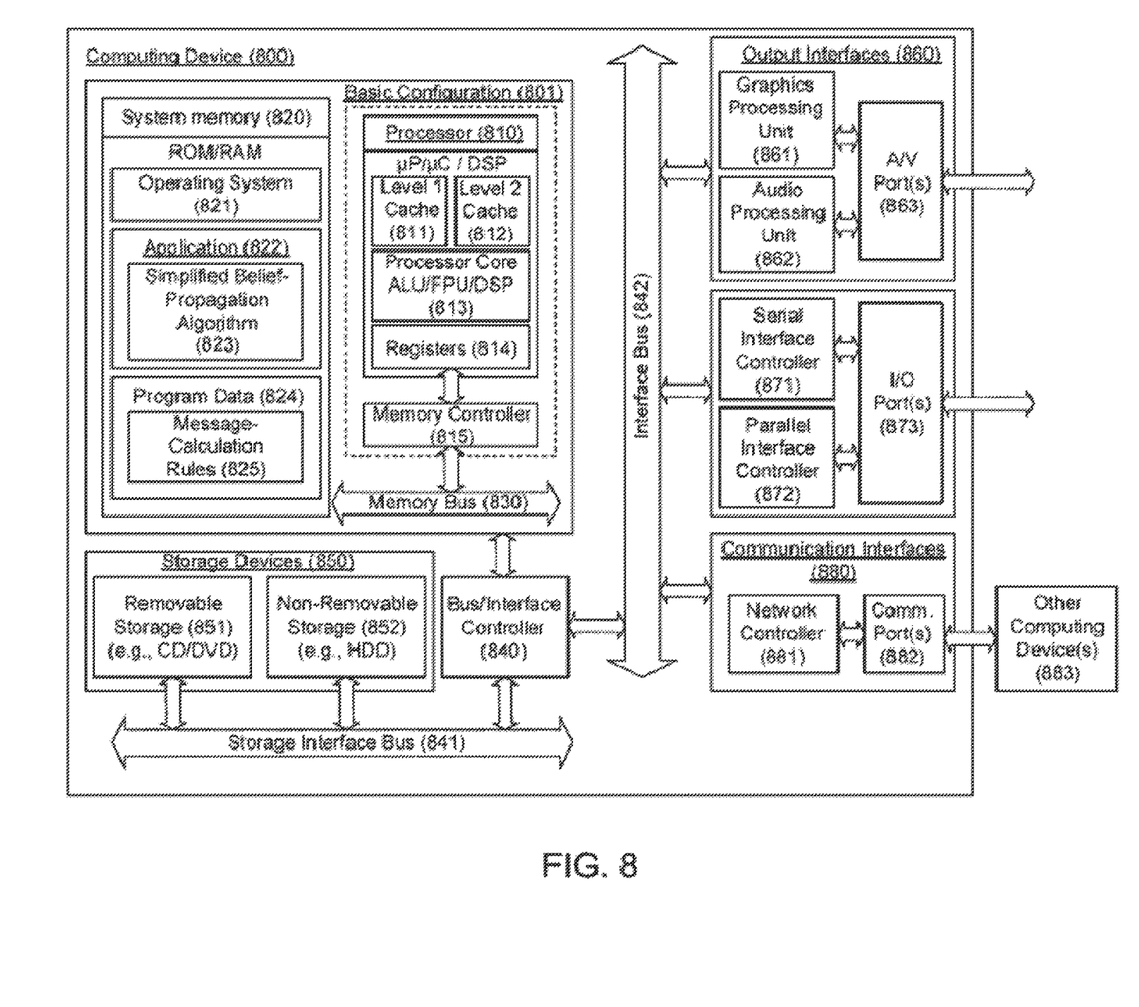
FIG. 8 depicts a block diagram of an example computing device arranged in accordance with at least some embodiments of the present disclosure.

FIG. 8 depicts a block diagram of an example computing device 800 arranged in accordance with at least some embodiments of the present disclosure. In various examples, the computing device 800 may be configured to facilitate a simplified belief-propagation algorithm that includes a set of message-calculation rules that have a low computational complexity for encoding data to be stored in a solid-state memory block with a reduced number of erasures and/or decoding data read from a memory block. In one example of a basic configuration 801, the computing device 800 may include one or more processors 810 and a system memory 820. A memory bus 830 can be used for communicating between the one or more processors 810 and the system memory 820.

Depending on the desired configuration, the one or more processors 810 may be of any type including, but not limited to, a microprocessor (µP), a microcontroller (µC), a digital signal processor (DSP), or any combination thereof. The one or more processors 810 may include one or more levels of caching, such as a level-1 cache 811 and a level-2 cache 812, a processor core 813, and registers 814. The processor core 813 can include an arithmetic logic unit (ALU), a floating point unit (FPU), a digital signal processing core (DSP core), or any combination thereof. A memory controller 815 can also be used with the one or more processors 810, or in some implementations, the memory controller 815 can be an internal part of the processor 810.

Depending on the desired configuration, the system memory 820 may be of any type including, but not limited to, volatile memory (such as RAM), non-volatile memory (such as ROM, flash memory, etc.) or any combination thereof. The system memory 820 may include an operating system 821, one or more applications 822, and program data 824. The one or more applications 822 may include a simplified belief-propagation algorithm that includes a set of message-calculation rules that have a low computational complexity for encoding data to be stored in a solid-state memory block with a reduced number of erasures and/or for decoding data read from a memory block 823 that can be arranged to perform the functions, actions, and/or operations as described herein including the functional blocks, actions, and/or operations described herein. The program data 824 may include message-calculation rules such as set forth in Eqs. 12-15 herein 825 for use with the simplified belief-propagation algorithm application 823. In some example embodiments, the one or more applications 822 may be arranged to operate with the program data 824 on the operating system 821. This described basic configuration 801 is depicted in FIG. 8 by those components within dashed line.

The computing device 800 may have additional features or functionality, and additional interfaces to facilitate communications between the basic configuration 801 and any required devices and interfaces. For example, a bus/interface controller 840 may be used to facilitate communications between the basic configuration 801 and one or more data storage devices 850 via a storage interface bus 841. The one or more data storage devices 850 may be removable storage devices 851, non-removable storage devices 852, or a combination thereof. Examples of removable storage and non-removable storage devices include magnetic disk devices, such as flexible disk drives and hard-disk drives (HDD), optical disk drives such as compact disk (CD) drives or digital versatile disk (DVD) drives, solid-state drives (SSD), and tape drives to name a few. Example computer-storage media may include volatile and nonvolatile, removable and non-removable media implemented in any method or technology for storage of information, such as computer-readable instructions, data structures, program modules, or other data.

The system memory 820, the removable storage 851 and the non-removable storage 852 are all examples of computer-storage media. The computer-storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by the computing device 800. Any such computer-storage media may be part of the computing device 800.

The computing device 800 may also include an interface bus 842 for facilitating communication from various interface devices (e.g., output interfaces, peripheral interfaces, and communication interfaces) to the basic configuration 801 via the bus/interface controller 840. Example output interfaces 860 may include a graphics processing unit 861 and an audio processing unit 862, which may be configured to communicate to various external devices such as a display or speakers via one or more A/V ports 863. Example peripheral interfaces 870 may include a serial interface controller 871 or a parallel interface controller 872, which may be configured to communicate with external devices such as input devices (e.g., keyboard, mouse, pen, voice input device, touch input device, etc.) or other peripheral devices (e.g., printer, scanner, etc.) via one or more I/O ports 873. An example communication interface 880 includes a network controller 881, which may be arranged to facilitate communications with one or more other computing devices 883 over a network communication via one or more communication ports 882. A communication connection is one example of a communication media. The communication media may typically be embodied by computer-readable instructions, data structures, program modules, or other data in a modulated data signal, such as a carrier wave or other transport mechanism, and may include any information-delivery media. A "modulated data signal" may be a signal that has one or more of its characteristics set or changed in such a manner as to encode information in the signal. By way of example, and not limitation, communication media may include wired media, such as a wired network or direct-wired connection, and wireless media such as acoustic, radio frequency (RF), infrared (IR) and other wireless media. The term computer-readable media as used herein may include both storage media and communication media.

The computing device 800 may be implemented as a portion of a small form-factor portable (or mobile) electronic device, such as, but not limited to, a cell phone, a mobile phone, a tablet device, a laptop computer, a personal data assistant (PDA), a personal media player device, a wireless web-watch device, a personal headset device, an application specific device, or a hybrid device that includes any of the above functions. The computing device 800 may also be implemented as a personal computer including both laptop computer and non-laptop computer configurations. In addition, the computing device 800 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device that manipulates or transforms data represented as physical electronic or magnetic quantities within memories, registers, or other information storage devices, transmission devices, or display devices of the computing device.

The claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal-bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with the claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be affected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. Those skilled in the art will, however, recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal-bearing medium used to actually carry out the distribution. Examples of a signal-bearing medium include, but are not limited to, the following: a recordable-type medium, such as a flexible disk, a hard disk drive (HDD), a Compact Disc (CD), a Digital Versatile Disk (DVD), a digital tape, a computer memory, etc.; and a transmission-type medium, such as a digital and/or an analog communication medium (e.g., a fiber optic cable, a waveguide, a wired communication link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include, but are not limited to, physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural configurations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes, but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. Use of such phrases should not, however, be construed to imply that the introduction of a claim recitation by the indefinite articles "a" or "an" limits any particular claim containing such introduced claim recitation to subject matter containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances in which a convention analogous to "at least one of A, B, and C, etc." is used, in general, such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). In those instances in which a convention analogous to "at least one of A, B, or C, etc." is used, in general, such a construction is intended in the sense one having skill in the art would understand the convention (e.g., "a system having at least one of A, B, or C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A method comprising:
receiving a first binary vector comprising a first group of data, the first group of data being encoded and stored in a memory block of a single-level cell-type flash memory as a second group of data subject to a current state of single-level cell-type flash memory cells in the memory block of the single-level cell-type flash memory, the second group of data corresponding to the encoded first group of data, each element of the first group of data corresponding to a row of a matrix parity-check equation, each element of the second group of data corresponding to a single-level cell-type flash memory cell in the memory block of the single-level cell-type flash memory and each element of the second group of data comprising an unknown variable of the matrix parity-check equation, wherein each row of the matrix parity-check equation corresponding to a check node of the matrix parity-check equation and each unknown variable corresponding to a variable node of the matrix parity-check equation;

determining a marginal probability of each element of the second group of data for a first selected configuration of the second group of data;

determining a value of at least one element of the second group of data according to the determined marginal probability of each element of the second group of data; and iteratively determining the marginal probability of each remaining undetermined element of the second group of data for subsequently selected configurations of the remaining undetermined elements of the second group of data, and determining a value of at least one remaining undetermined element of the second group of data until all elements of the second group of data have been determined, wherein solutions to the matrix parity-check equation are subject to a constraint that a value of an element of the second group of data is zero if the current state of a corresponding single-level cell-type flash memory cell in the memory block is zero.

2. The method according to claim 1, wherein the matrix parity-check equation comprises:

$$A\hat{x} = \hat{y},$$

in which vector $\hat{x}$ comprises a second binary vector representing the second group of data, matrix A is a pre-designed sparse matrix, vector $\hat{y}$ comprises the first binary vector representing the first group of data to be encoded, and a vector $\hat{s}$ comprises current states of the single-level cell-type flash memory cells in the memory block of the single-level cell-type flash memory, and in which the solutions to the matrix parity-check equation are subject to the constraint $x(n)=0$ if $s(n)=0$ for the n-th element of $\hat{x}$ and $\hat{s}$, respectively.

3. The method according to claim 2, wherein the matrix A further comprises a low-density parity-check matrix.

4. The method according to claim 2, wherein determining the marginal probability of each element of the second group of data for the first selected configuration of the second group of data comprises exchanging messages between neighboring variable nodes and check nodes of the matrix parity-check equation, the messages exchanged from the variable nodes to the check nodes being determined based on message-calculation rules that comprise convex combination adjust terms.

5. The method according to claim 4, wherein the message-calculation rules for the messages exchanged from the variable nodes to the check nodes comprise:

$$M_{i \to a}^0 \leftarrow (1-\alpha)\left(\prod_{b \in N(i)} M_{b \to i}^0\right)\left(\prod_{b \in N(i)\setminus[a]} M_{b \to i}^0\right), \text{ and}$$

$$M_{i \to a}^1 \leftarrow \left[\alpha\left(\prod_{b \in N(i)} M_{b \to i}^0 + \prod_{b \in N(i)} M_{b \to i}^1\right) + \prod_{b \in N(i)} M_{b \to i}^1\right]\left(\prod_{b \in N(i)\setminus[a]} M_{b \to i}^1\right),$$

wherein the message-calculation rules for the messages exchanged from the check nodes to the variable nodes comprise:

$$M_{a \to i}^0 \leftarrow \left[\prod_{j \in N(a)\setminus[i]} (M_{j \to a}^0 + M_{j \to a}^1) + \prod_{j \in N(a)\setminus[i]} (M_{j \to a}^0 - M_{j \to a}^1)\right], \text{ and}$$

$$M_{a \to i}^1 \leftarrow \left[\prod_{j \in N(a)\setminus[i]} (M_{j \to a}^0 + M_{j \to a}^1) - \prod_{j \in N(a)\setminus[i]} (M_{j \to a}^0 - M_{j \to a}^1)\right], \text{ and}$$

wherein, $M_{i \to a}^0$: zero message from a variable i to a check a (tentatively calculated marginal probability that the variable i equals zero), $M_{i \to a}^1$: one message from a variable i to a check a (tentatively calculated marginal probability that the variable i equals one), $M_{a \to i}^0$: zero message from a check a to a variable i (tentatively calculated marginal probability that the variable i equals zero), $M_{a \to i}^1$: one message from a check a to a variable i (tentatively calculated marginal probability that the variable i equals one), variable nodes are denoted by i, j, and k, check nodes are denoted by a, b, and c, $\alpha$ is a pre-designed constant, $0 \leq \alpha \leq 1$, N(a) denotes the set of neighboring variable nodes of the check node a, and N(i) denotes the set of neighboring check nodes of the variable node i.

6. The method according to claim 5, further comprising:
receiving a fourth group of data that was stored in the single-level cell-type flash memory; and
decoding the fourth group of data using the matrix parity-check equation.

7. The method according to claim 1, wherein determining the value of the at least one element of the second group of data comprises determining that the row of the matrix parity-check equation is satisfied.

8. A machine-readable non-transitory medium having stored therein instructions that, when executed by one or more processors, operatively enable a data encoding module to:

receive a first binary vector comprising a first group of data, the first group of data being encoded and stored in a memory block of a single-level cell-type flash memory as a second group of data subject to a current state of single-level cell-type flash memory cells in the memory block of the single-level cell-type flash memory, the second group of data corresponding to the encoded first group of data, each element of the first group of data corresponding to a row of a matrix parity-check equation, each element of the second group of data corresponding to a single-level cell-type flash memory cell in the memory block of the flash memory and each element of the second group of data comprising an unknown variable of the matrix parity-check equation, wherein each row of the matrix parity-check equation corresponding to a check node of the matrix parity-check equation and each unknown variable corresponding to a variable node of the matrix parity-check equation;

determine a marginal probability of each element of the second group of data for a first selected configuration of the second group of data;

determine a value of at least one element of the second group of data according to the determined marginal probability of each element of the second group of data; and iteratively determine the marginal probability of each remaining undetermined element of the second group of data for subsequently selected configurations of the remaining undetermined elements of the second group of data, and determine a value of at least one remaining undetermined element of the second group of data until all elements of the second group of data have been determined, wherein solutions to the matrix parity-check equation are subject to a constraint that a value of an element of the second group of data is zero if the current state of a corresponding single-level cell-type flash memory cell in the memory block is zero.

9. The machine-readable non-transitory medium according to claim 8, wherein the matrix parity-check equation comprises:

$$A\hat{x}=\hat{y},$$

in which vector $\hat{x}$ comprises a second binary vector representing the second group of data, matrix A is a pre-designed sparse matrix, vector $\hat{y}$ comprises the first binary vector representing the first group of data to be encoded, and a vector $\hat{s}$ comprises current states of the single-level cell-type flash memory cells in the memory block of the single-level cell-type flash memory, and in which the solutions to the matrix parity-check equation are subject to the constraint x(n)=0 if s(n)≤0 for the n-th element of $\hat{x}$ and $\hat{s}$, respectively.

10. The machine-readable non-transitory medium according to claim 9, wherein the matrix A further comprises a low-density parity-check matrix.

11. The machine-readable non-transitory medium according to claim 9, wherein the determination of the marginal probability of each element of the second group of data for the first selected configuration of the second group of data comprises an exchange of messages between neighboring variable nodes and check nodes of the matrix parity-check equation, the messages exchanged from the variable nodes to the check nodes being determined based on message-calculation rules that comprise convex combination adjust terms.

12. The machine-readable non-transitory medium according to claim 11, wherein the message-calculation rules for the messages exchanged from the variable nodes to the check nodes comprise:

$$M_{i \to a}^0 \leftarrow (1-\alpha)\left(\prod_{b \in N(i)} M_{b \to i}^0\right)\left(\prod_{b \in N(i) \setminus \{a\}} M_{b \to i}^0\right), \text{ and}$$

$$M_{i \to a}^1 \leftarrow \left[\alpha\left(\prod_{b \in N(i)} M_{b \to i}^0 + \prod_{b \in N(i)} M_{b \to i}^1\right) + \prod_{b \in N(i)} M_{b \to i}^1\right]\left(\prod_{b \in N(i) \setminus \{a\}} M_{b \to i}^1\right),$$

wherein the message-calculation rules for the messages exchanged from the check nodes to the variable nodes comprise:

$$M_{a \to i}^0 \leftarrow \left[\prod_{j \in N(a) \setminus \{i\}} (M_{j \to a}^0 + M_{j \to a}^1) + \prod_{j \in N(a) \setminus \{i\}} (M_{j \to a}^0 - M_{j \to a}^1)\right], \text{ and}$$

$$M_{a \to i}^1 \leftarrow \left[\prod_{j \in N(a) \setminus \{i\}} (M_{j \to a}^0 + M_{j \to a}^1) - \prod_{j \in N(a) \setminus \{i\}} (M_{j \to a}^0 - M_{j \to a}^1)\right], \text{ and}$$

wherein, $M_{i \to a}^0$: zero message from a variable i to a check a (tentatively calculated marginal probability that the variable i equals zero), $M_{i \to a}^1$: one message from a variable i to a check a (tentatively calculated marginal probability that the variable i equals one), $M_{a \to i}^0$: zero message from a check a to a variable i (tentatively calculated marginal probability that the variable i equals zero), $M_{a \to i}^1$: one message from a check a to a variable i (tentatively calculated marginal probability that the variable i equals one), variable nodes are denoted by i, j, and k,
check nodes are denoted by a, b, and c,
$\alpha$ is a pre-designed constant, $0 \leq \alpha \leq 1$,
N(a) denotes the set of neighboring variable nodes of the check node a, and
N(i) denotes the set of neighboring check nodes of the variable node i.

13. The machine-readable non-transitory medium according to claim 8, wherein the stored instructions that, when executed by the one or more processors, further operatively enable a decoder module to:

receive a fourth group of data that was stored in the single-level cell-type flash memory; and
decode the fourth group of data using the matrix parity-check equation.

14. The machine-readable non-transitory medium according to claim 8, wherein the determination of the value of the at least one element of the second group of data comprises a determination that the row of the matrix parity-check equation is satisfied.

15. A system, comprising:
a module configured to encode data;
a machine-readable non-transitory medium having stored therein instructions that, when executed by one or more processors, operatively enable the module to:
receive a first binary vector comprising a first group of data, the first group of data being encoded and stored in a memory block of a single-level cell-type flash memory as a second group of data subject to a current state of single-level cell-type flash memory cells in the memory block of the single-level cell-type flash memory, the second group of data corresponding to the encoded first group of data, each element of the first group of data corresponding to a row of a matrix parity-check equation, each element of the second group of data corresponding to a single-level cell-type flash memory cell in the memory block of the single-level cell-type flash memory and each element of the second group of data comprising an unknown variable of the matrix parity-check equation, wherein each row of the matrix parity-check equation corresponding to a check node of the matrix parity-check equation and each unknown variable corresponding to a variable node of the matrix parity-check equation;
determine a marginal probability of each element of the second group of data for a first selected configuration of the second group of data;
determine a value of at least one element of the second group of data according to the determined marginal probability of each element of the second group of data; and
iteratively determine the marginal probability of each remaining undetermined element of the second group of data for subsequently selected configurations of the remaining undetermined elements of the second group of data, and determine a value of at least one remaining undetermined element of the second group of data until all elements of the second group of data have been determined, wherein solutions to the matrix parity-check equation are subject to a constraint that a value of an element of the second group of data is zero if the current state of a corresponding single-level cell-type flash memory cell in the memory block is zero.

16. The system according to claim 15, wherein the matrix parity-check equation comprises:

$$A\hat{x}=\hat{y},$$

in which vector $\hat{x}$ comprises a second binary vector representing the second group of data, matrix A is a pre-designed sparse matrix, vector $\hat{y}$ comprises the first binary vector representing the first group of data to be encoded, and a vector $\hat{s}$ comprises current states of the single-level cell-type flash memory cells in the memory block of the single-level cell-type flash memory, and in which the solutions to the matrix parity-check equation are subject to the constraint x(n)=0 if s(n)=0 for the n-th element of $\hat{x}$ and $\hat{s}$, respectively.

17. The system according to claim 16, wherein the matrix A further comprises a low-density parity-check matrix.

18. The system according to claim 16, wherein the determination of the marginal probability of each element of the second group of data for the first selected configuration of the second group of data comprises an exchange of messages between neighboring variable nodes and check nodes of the matrix parity-check equation, the messages exchanged from the variable nodes to the check nodes being determined based on message-calculation rules that comprise convex combination adjust terms.

19. The system according to claim 18, wherein the message-calculation rules for the messages exchanged from the variable nodes to the check nodes comprise:

$$M_{i \to a}^0 \leftarrow (1-\alpha)\left(\prod_{b \in N(i)} M_{b \to i}^0\right)\left(\prod_{b \in N(i)\setminus\{a\}} M_{b \to i}^0\right), \text{ and}$$

$$M_{i \to a}^1 \leftarrow \left[\alpha\left(\prod_{b \in N(i)} M_{b \to i}^0 + \prod_{b \in N(i)} M_{b \to i}^1\right) + \prod_{b \in N(i)} M_{b \to i}^1\right]\left(\prod_{b \in N(i)\setminus\{a\}} M_{b \to i}^1\right),$$

wherein the message-calculation rules for the messages exchanged from the check nodes to the variable nodes comprise:

$$M_{a \to i}^0 \leftarrow \left[\prod_{j \in N(a)\setminus\{i\}} (M_{j \to a}^0 + M_{j \to a}^1) + \prod_{j \in N(a)\setminus\{i\}} (M_{j \to a}^0 - M_{j \to a}^1)\right], \text{ and}$$

$$M_{a \to i}^1 \leftarrow \left[\prod_{j \in N(a)\setminus\{i\}} (M_{j \to a}^0 + M_{j \to a}^1) - \prod_{j \in N(a)\setminus\{i\}} (M_{j \to a}^0 - M_{j \to a}^1)\right], \text{ and}$$

wherein, $M_{i \to a}^0$: zero message from a variable i to a check a (tentatively calculated marginal probability that the variable i equals zero), $M_{i \to a}^1$: one message from a variable i to a check a (tentatively calculated marginal probability that the variable i equals one), $M_{a \to i}^0$: zero message from a check a to a variable i (tentatively calculated marginal probability that the variable i equals zero), $M_{a \to i}^1$: one message from a check a to a variable i (tentatively calculated marginal probability that the variable i equals one), variable nodes are denoted by i, j, and k, check nodes are denoted by a, b, and c, $\alpha$ is a pre-designed constant, $0 \leq \alpha \leq 1$, N(a) denotes the set of neighboring variable nodes of the check node a, and N(i) denotes the set of neighboring check nodes of the variable node i.

20. The system according to claim 15, wherein the stored instructions that, when executed by the one or more processors, further operatively enable a decoder module to:

receive a fourth group of data that was stored in the single-level cell-type flash memory; and decode the fourth group of data using the matrix parity-check equation.

21. The system according to claim 15, wherein the determination of value of the at least one element of the second group of data comprises a determination that the row of the matrix parity-check equation is satisfied.

* * * * *

UNITED STATES PATENT AND TRADEMARK OFFICE
CERTIFICATE OF CORRECTION

PATENT NO. : 9,859,925 B2
APPLICATION NO. : 14/785582
DATED : January 2, 2018
INVENTOR(S) : Ma Page 1 of 1

It is certified that error appears in the above-identified patent and that said Letters Patent is hereby corrected as shown below:

In the Claims

In Column 16, Line 53, in Claim 8, delete "the flash" and insert -- the single-level cell-type flash --, therefor.

In Column 17, Line 28, in Claim 9, delete "$x(n)= 0$ if $s(n) \leq 0$" and insert -- $x(n)= 0$ if $s(n)= 0$ --, therefor.

Signed and Sealed this
First Day of May, 2018

Andrei Iancu
*Director of the United States Patent and Trademark Office*